(12) United States Patent
Dawe (10) Patent No.: US 7,764,125 B2
(45) Date of Patent: Jul. 27, 2010

(54) RECONFIGURABLE TUNABLE RF POWER AMPLIFIER

(75) Inventor: Geoffrey C Dawe, Newburyport, MA (US)

(73) Assignee: BitWave Semiconductor, Inc., Lowell, MA (US)

( * ) Notice: Subject to any disclaimer, the term of this patent is extended or adjusted under 35 U.S.C. 154(b) by 0 days.

(21) Appl. No.: 12/126,030

(22) Filed: May 23, 2008

(65) Prior Publication Data

US 2008/0290947 A1 Nov. 27, 2008

Related U.S. Application Data

(60) Provisional application No. 60/940,022, filed on May 24, 2007.

(51) Int. Cl.
*H03F 3/04* (2006.01)
(52) U.S. Cl. ...................... 330/305; 330/302
(58) Field of Classification Search ................ 330/305, 330/302
See application file for complete search history.

(56) References Cited

U.S. PATENT DOCUMENTS

| | | | |
|---|---|---|---|
| 6,621,365 B1 | 9/2003 | Hallivuori et al. | |
| 6,765,439 B2 * | 7/2004 | Choi | 330/129 |
| 7,020,444 B2 | 3/2006 | Shinbo et al. | |
| 7,053,726 B2 | 5/2006 | Hino | |
| 7,088,129 B2 * | 8/2006 | Humphrey et al. | 326/30 |
| 7,103,337 B2 | 9/2006 | Uozumi et al. | |
| 7,151,411 B2 | 12/2006 | Martin et al. | |
| 7,221,327 B2 * | 5/2007 | Toncich | 343/860 |
| 7,379,714 B2 * | 5/2008 | Haque et al. | 455/107 |
| 7,493,094 B2 * | 2/2009 | Ichitsubo et al. | 455/127.1 |
| 2002/0093385 A1 | 7/2002 | Nishiyama et al. | |
| 2007/0085602 A1 | 4/2007 | Park et al. | |
| 2009/0051441 A1* | 2/2009 | Branch et al. | 330/305 |

FOREIGN PATENT DOCUMENTS

| | | |
|---|---|---|
| EP | 0622894 B1 | 7/2000 |
| JP | 2001016044 A | 1/2001 |
| JP | 2002076780 A | 3/2002 |
| WO | 03061108 A1 | 7/2003 |
| WO | 03061174 A2 | 7/2003 |
| WO | 2005078916 A1 | 8/2005 |

OTHER PUBLICATIONS

Dehng, G.K. et al., "A Single-Chip RF Transceiver for Quad-Band GSM/GPRS Applications", IEEE Radio frequency integrated circuits symposium, 2004.
Hung-Lung Tu, Steve, "A Power-Adaptive CMOS Class E RF Tuned Power Amplifier for Wireless Communications," IEEE 2003.

* cited by examiner

*Primary Examiner*—Patricia Nguyen
(74) *Attorney, Agent, or Firm*—Lando & Anastasi, LLP (57) ABSTRACT

A multi-band, multi-standard programmable power amplifier having tunable impedance matching input and output networks and programmable device characteristics. The impedance of either or both of the impedance matching input and output networks is tunable responsive to one or more control signals. In one example, the programmable power amplifier incorporates a feedback control loop and the control signal(s) are varied responsive to the feedback loop.

13 Claims, 10 Drawing Sheets

RECONFIGURABLE TUNABLE RF POWER AMPLIFIER

CROSS REFERENCE TO RELATED APPLICATIONS

This application claims priority under 35 U.S.C. §119(e) to U.S. Provisional Patent Application No. 60/940,022 filed May 24, 2007 and entitled "RECONFIGURABLE AND TUNABLE RF POWER AMPLIFIER," which is herein incorporated by reference in its entirety.

BACKGROUND

1. Field of Invention

The present invention relates generally to power amplifiers and, more particularly, to power amplifiers for multi-band, multi-standard transceivers.

2. Discussion of Related Art

Figure 1:
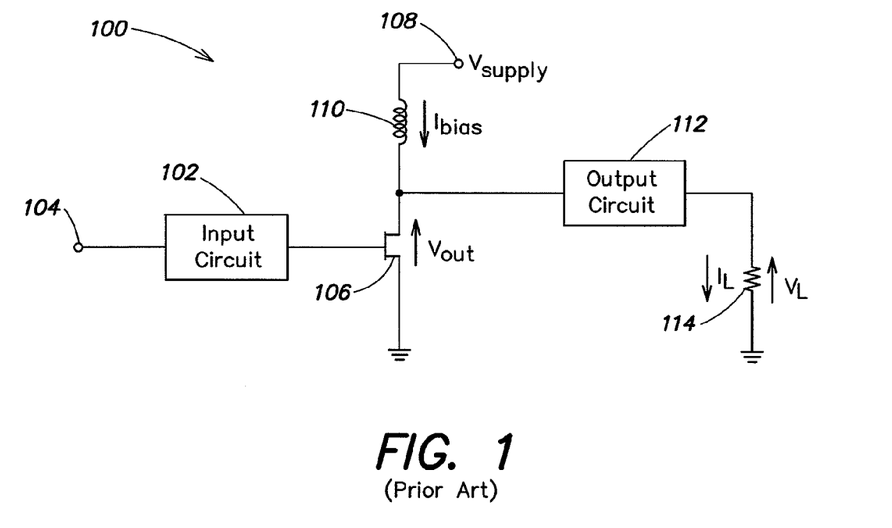
FIG. 1 is a block diagram of an example of a conventional power amplifier circuit including an output circuit for impedance matching.

Typical radio frequency (RF) power amplifier circuits use impedance-varying circuitry, such as an impedance transformer, impedance matching circuit or tank circuit, at their outputs in order to enhance performance. An example of this configuration is illustrated in FIG. 1. The RF power amplifier circuit 100 includes an input circuit 102 coupled between an input terminal 104 where the RF signal to be amplified is applied, and the base (or gate) of the power transistor 106. A bias current, $I_{BIAS}$, is provided to the transistor 106 from a supply voltage terminal 108 via an inductor 110, and an output voltage, $V_{OUT}$, is generated across the transistor. The transistor 106 drives a load 114 via the output circuit 112, with a load current, $I_{LOAD}$ drawn by the load and a corresponding load voltage, $V_{LOAD}$, generated across the load. The power provided to the load, $P_{LOAD}$, is given by the following equation:

$$P_{LOAD} = V_{LOAD} * I_{LOAD} * \cos(\theta) \tag{1}$$

Wherein $\theta$ is the phase angle between the load voltage, $V_{LOAD}$, and load current, $I_{LOAD}$, used to calculate the power, $P_{LOAD}$.

The output circuit 112 is generally narrow-band in order to maximize performance of the power amplifier circuit 100 at a given frequency. However, in many modern applications, such as mobile telephone handsets or wireless network cards for computers, wide-band or multi-band operation may be required or desirable and therefore, the power amplifier should have good performance over a wide frequency bandwidth. Conventional attempts to increase the bandwidth of the output circuit (and thus the power amplifier circuit) using feedback control, multi-stage reactive matching and other techniques, decrease most power metrics of the power amplifier circuit, including the output power, $P_{LOAD}$, delivered to the load, the efficiency, $\eta$ (given by equation (2) below), the Mask (being the standards body-defined limits of spectral emissions for a transmitter, usually given in dBc/Hz or dBm/Hz), and the error vector magnitude (i.e., the difference between the desired symbol location in the constellation and the actual symbol location).

SUMMARY OF INVENTION

Accordingly, aspects and embodiments of the invention are directed to power amplifier circuit that is programmable and tunable over a wide operating frequency range and can accommodate various different communications standards.

According to one embodiment, a programmable power amplifier comprises an amplifier, an impedance matching input circuit coupled to an input of the amplifier, and an impedance matching output network coupled to an output of the amplifier, the impedance matching output network having a programmable impedance that is adjustable responsive to an impedance control signal. The amplifier may comprise a power transistor. The impedance matching output network may comprise a plurality of impedance elements including at least one programmable impedance element that is programmable responsive to the impedance control signal. In one example, the at least one programmable impedance element includes a bank of switchable capacitors and/or a varactor. The impedance matching input circuit may also comprise at least one programmable impedance element that is programmable responsive to a second impedance control signal. Furthermore, the power transistor may comprise a programmable bias circuit including a parallel resonance circuit comprising an inductor and a bank of switchable capacitors that are switched into and out of the bias circuit responsive to a bias control signal. In one example, the parallel resonance circuit further comprises a varactor. In another example, the power transistor has a variable gate width, wherein the variable gate width is programmable responsive to a transistor control signal.

According to another embodiment, a digital programmable power amplifier comprises an amplifier stage, a programmable impedance matching input circuit coupled to an input of the amplifier stage, a programmable impedance matching output network coupled to an output of the amplifier stage, an error generator coupled to an output of the programmable impedance matching output network and configured to compare a signal received from the programmable impedance matching output network with a reference signal to generate an error signal, a control circuit coupled to the error generator and configured to receive the error signal, and a digital programming bus coupled to the control circuit and to each of the amplifier stage, the programmable impedance matching input network and the programmable impedance matching output network. The control circuit is configured to generate at least one digital control signal responsive to the error signal and to provide the at least one digital control signal to the amplifier, the programmable impedance matching input network and the programmable impedance matching output network via the digital programming bus. Parameters of the amplifier, the programmable impedance matching input network and the programmable impedance matching output network are variable responsive to the at least one digital control signal.

In one example, the parameters that are variable responsive to the at least one digital control signal include any of an impedance of the impedance matching output network, an impedance of the impedance matching input network, and a device width of the amplifier. The amplifier may include a FET transistor having a variable gate width that is variable responsive to the at least one digital control signal.

Another embodiment is directed to a method of tuning an operating frequency of a power amplifier that includes an programmable impedance matching output network. In one example, the method comprises comparing at least a portion of an output signal from the power amplifier with a reference signal to generate an error signal, generating a control signal responsive to the error signal, and varying an impedance of the programmable impedance matching output network of the power amplifier responsive to the control signal. The method may also include varying a gate width of the power transistor, and/or varying the impedance of a programmable impedance matching input circuit of the amplifier.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures. In the figures, which are not intended to be drawn to scale, each identical or nearly identical component that is illustrated in various figures is represented by a like numeral. For purposes of clarity, not every component may be labeled in every drawing. The figures are provided for the purposes of illustration and explanation and are not intended as a definition of the limits of the invention. In the figures.

DETAILED DESCRIPTION

Modern communications devices, such as mobile telephone handsets, portable computers, personal digital assistants (PDAs), etc. operate in varying frequency ranges using a variety of communications protocols. Therefore, these devices may include multi-band, multi-mode transceiver architectures designed to accommodate various frequency bands and modes for today's different communication standards and protocols such as, for example, GSM (Groupe Special Mobile), CDMA (Code Division Multiple Access), CDMA2k (Code Division Multiple Access 2000), W-CDMA, UMTS (Universal Mobil Telecommunications Systems), IEEE 802.11a/b/g, and the like. Accordingly, the RF power amplifier used in conjunction with such multi-band, multi-mode transceivers should also have a wide operating bandwidth to be able to accommodate various operating frequency bands. However, as discussed above, the output circuit used to match the power amplifier output impedance to the impedance of its load is typically narrowband to enhance performance, and conventional approaches to increasing the bandwidth adversely affect power performance metrics.

Therefore, aspects and embodiments are directed to a power amplifier including a tunable narrowband output network that can be programmed to change the instantaneous operating frequency of the power amplifier and/or the impedance of the output network, so as to modify functionality or improve performance of the power amplifier. By allowing parameters of the output network, including its impedance, to be tunable and programmable, good performance may be achieved over several different operating frequency bands, as discussed further below.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Figure 2:
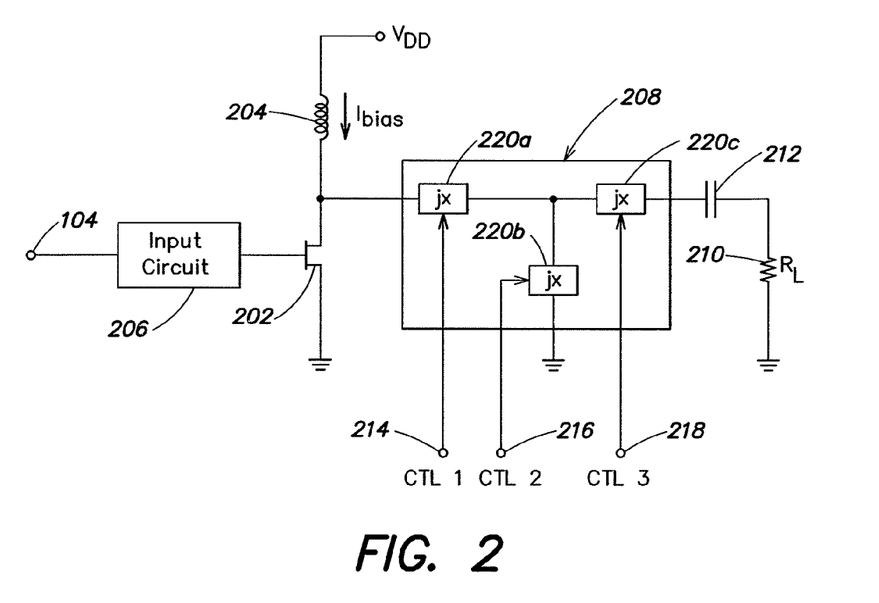
FIG. 2 is a block diagram of one example of a programmable power amplifier circuit according to aspects of the invention.

Referring to FIG. 2, there is illustrated a block diagram of one example of a programmable and tunable power amplifier according to aspects of the invention. The power amplifier includes an amplifier stage, which typically may include a power transistor 202, coupled to a supply voltage, $V_{DD}$, via an inductance 204, through which is flowed a bias current, $I_{BIAS}$, for the power transistor. The inductor 204 acts as a bias choke to prevent shorting of the AC supply voltage to the AC ground. The power transistor 202 is coupled between an input circuit 206 and an output network 208. The output network 208 is coupled to a load, represented by a resistor 210, via a capacitor 212. It is to be appreciated that the resistor 210 is intended to be representative of any load that may be coupled to the output of the power amplifier and may be a complex circuit rather than a physical resistor. In one example, the power transistor 202 is a FET transistor which may be implemented, for example, using CMOS technology. In this example, the input circuit 206 is connected to the gate of the power transistor 202, as illustrated in FIG. 2. However, it is to be appreciated that the invention is not limited to the use of FET transistors and other types of transistors (e.g., BJT transistors) may be used. In addition, if implemented using semiconductor technologies, the transistor 202 may be n-type or p-type depending on design choice. Control signals CTL1, CTL2 and CTL3 may be applied to the output network 208 via control terminals 214, 216 and 218, respectively, to tune or program parameters of the output network, as discussed further below.

According to one embodiment, the control signals CTL1, CTL2 and CTL3 are used to tune the impedance of the output network 208 so as to vary the operating frequency of the power amplifier. For example, the output network 208 may include resistive and/or reactive impedance elements 220a, 220b and 220c which together define the output impedance of the output network 208 and the resistance and/or reactance of which can be tuned by the control signals CTL1, CTL2 and CTL3, respectively. It is to be appreciated that although FIG. 2 illustrates three impedance elements 220a, 220b and 220c, and three corresponding control signals CTL1, CTL2 and CTL3, the invention is not so limited, and the output network may comprise any number of impedance elements 220 and a corresponding number of control signals. In addition, it is to be appreciated that each impedance element 220 need not have a dedicated control signal, but instead, one or more control signals may be shared among a number of impedance elements. The impedance elements 220a, 220b and 220c may include, for example, any combination of fixed and/or tunable resistors, capacitors, varactors, and inductors. In one example, these elements can be directly tunable (for example, the capacitance of a varactor may be tuned by varying a corresponding control voltage or current). In another example, the resistance and/or reactance of a given impedance element 220 may be varied by switching in and out of connection selected fixed-value components. For example, an impedance element (e.g., element 220a) may include a bank of switchable fixed-value capacitors, such that the total capacitance of the impedance element is given by a combination of all the connected ones of the fixed-value capacitors. Selection of components to be connected may be responsive to the control signal, as discussed further below. By varying the resistance and/or reactance of each of the impedance elements 220a, 220b, 220c in the output network 208, responsive to the control signals, CTL1, CTL2, CTL3, the total impedance of the output network may be varied and thus, the operating frequency of the power amplifier may be varied.

In another example, the control signals CTL1, CTL2, CTL3 may be used to select one or more of the impedance elements 220a, 220b or 220c to be connected between the power transistor 202 and the capacitor 212, while disconnecting the other impedance elements. Each impedance element 220a, 220b, 220c may be configured, for example, by the arrangement and values of its components, to have a predefined impedance and/or to match the output impedance of the power amplifier to the load 210 for a particular operating frequency or frequency band. Each impedance element 220a, 220b, 220c may be switchably connected between the power transistor 202 and the capacitor 212, and this switchable connection may be controlled by the control signals CTL1, CTL2, CTL3. For example, activating control signal CTL1 and deactivating control signals CTL2 and CTL3 may result in impedance element 220a being connected between the power transistor 202 and the capacitor 212, and impedance elements 220b and 220c being disconnected. Thus, the impedance elements 220a, 220b and 200c may be switched in and out by activating or deactivating their respective control signals, CTL1, CTL2 and CTL3, thereby tuning the impedance of the output network 208 and the operating frequency of the power amplifier.

Figure 3A:
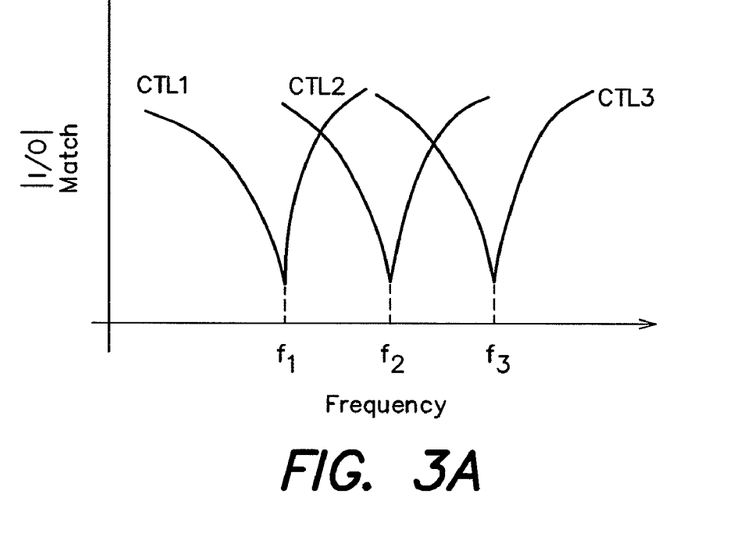
FIG. 3A is an illustration of power amplifier return loss (impedance match) as a function of frequency for various control voltages according to aspects of the invention.
Figure 3B:
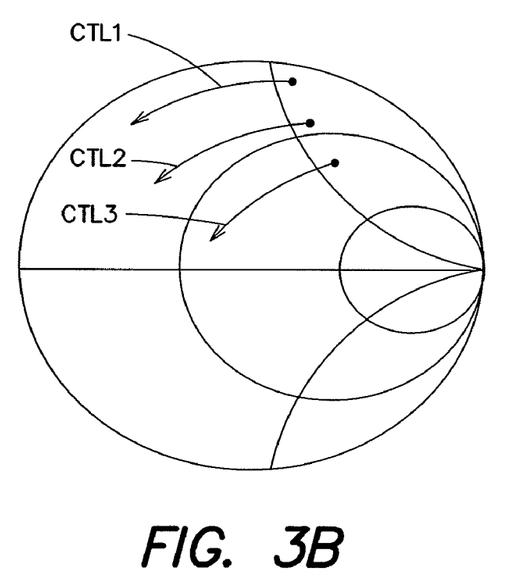
FIG. 3B is a corresponding smith chart illustration of the return loss versus frequency illustrated in FIG. 3A.

For example, referring to FIG. 3A, there is illustrated an example of the return loss, that is the input/output impedance match of the power amplifier, as a function of frequency for an example of the power amplifier. As can be seen in FIG. 3A, the output (or input) impedance of the power amplifier may be tuned so as to provide a good match (and therefore low return loss) at different operating frequencies using the different control signals CTL1, CTL2 and CTL3. FIG. 3B shows the data of FIG. 3A plotted on a smith chart to illustrate the resistive and reactive impedance changes with different control signal settings.

According to one embodiment, in addition to frequency tuning to achieve a multi-band operation, a programmable power amplifier may have multi-standard capability. As discussed above, modern transceivers may operate across a variety of communications standards as well as frequency bands. Therefore, it may be desirable to have a single power amplifier with multi-standard capability rather than having to use multiple power amplifiers in the transceiver. A power amplifier with both multi-standard capability, as discussed further below, and frequency tuning may be made applicable to several diverse communications standards, such as GSM, W-CDMA, WiFi, and WiMax, and may provide improved cost/performance versus benefit metrics.

Figure 4:
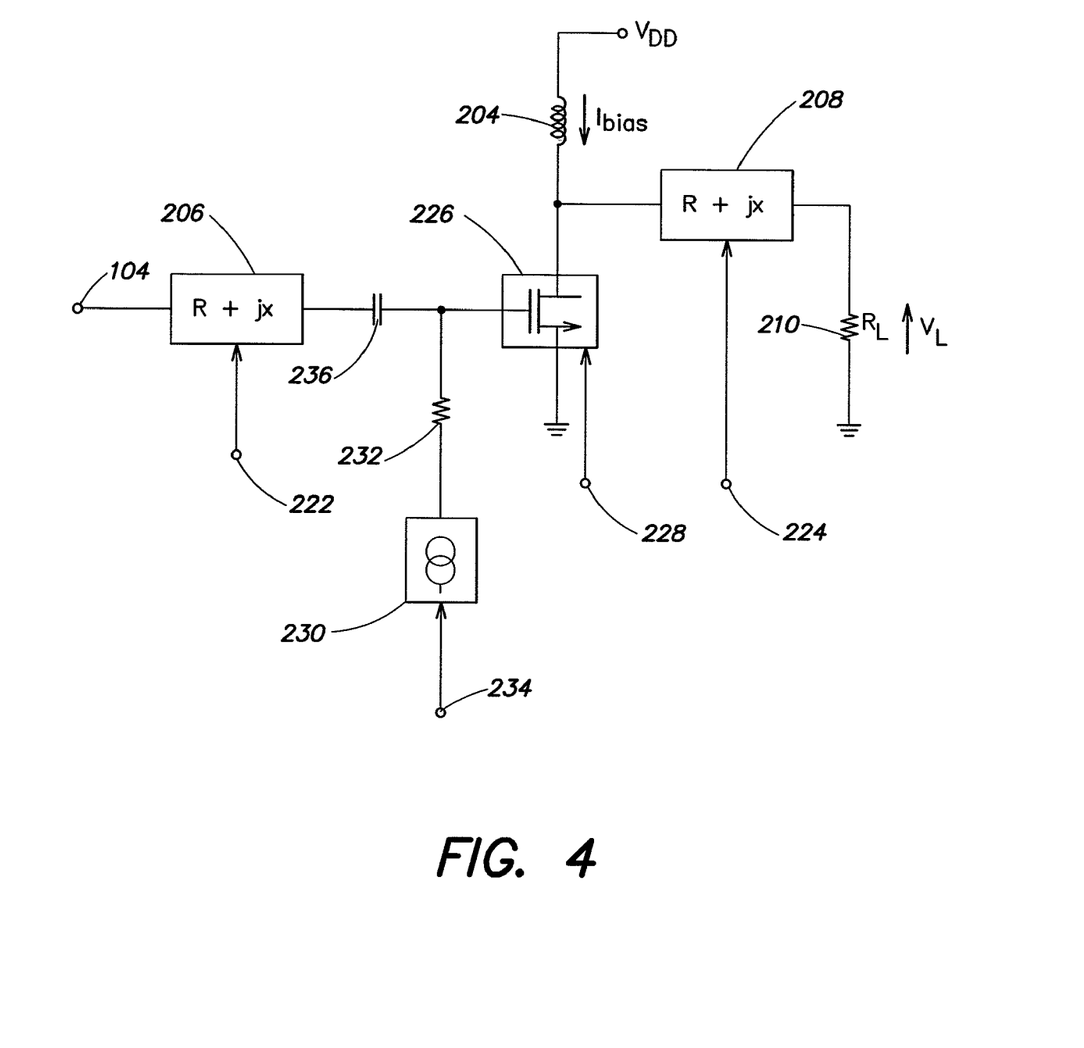
FIG. 4 is a block diagram of another example of a programmable power amplifier circuit according to aspects of the invention.

To achieve multi-standard capability, along with frequency agility, parameters of the power amplifier such as, for example, transistor bias current, transistor size, and bias point of the transistor, may be made programmable. Referring to FIG. 4, there is illustrated one example of a programmable power amplifier circuit that may be used in a multi-band, multi-standard transceiver. The power amplifier circuit comprises the amplifier stage 226, including the power transistor 202, coupled between an input circuit 206 and an output network 208, each of which has programmable impedance. One or more impedance control signals may be applied to the programmable input circuit 206 via control terminal 222 to tune the impedance of the input circuit. Tuning the input circuit impedance allows more power from the input signal (at terminal 104) to be delivered to the power transistor 202, and to be processed (e.g., amplified) by it, rather than being reflected back to the source connected to the input terminal 104. This improves the efficiency of the power amplifier circuit, which is an important metric for power amplifiers and transmitters. Similarly, one or more impedance control signals may be applied to the programmable output network 208 via control terminal 224 to tune the impedance of the output network, as discussed above. A transistor control signal may also be applied to the power transistor 202 via transistor control terminal 228. The transistor control signal may be used to program parameters of the power transistor 202, such as the device size and biasing. For example, if the power transistor 202 is a CMOS FET transistor, the transistor control signal may be used to program the gate width, bias current, and/or bias voltage, as discussed further below.

Still referring to FIG. 4, in one embodiment, a current source 230 can be coupled to the power transistor 202, optionally via a resistor 232. The resistor 232 is used in the bias circuit for the power transistor 202 to prevent or reduce noise generated in the bias circuit from entering the signal path of the amplifier. In one example, the resistor 232 together with the input capacitance of the transistor 226 forms a first order noise filter. The current source 230 may provide a current to the power transistor 202 to set a bias point of the transistor. A bias control signal may be applied to the current source 230 via bias control terminal 234 to control the current supplied by the current source, and thereby to set and/or vary the bias point of the power transistor 202. A coupling capacitor 236 may be coupled between the input circuit 206 and the amplifier stage 226, as illustrated in FIG. 4, to allow signal path cascading with DC bias points needing to be shared between stages.

It is to be appreciated that although for each of the programmable input circuit 206, current source 230, power transistor 202 and output network 208, only a single respective control terminal is illustrated, the invention is not so limited. Any of the input circuit 206, current source 230, power transistor 202 and output network 208 may be programmed using one or more control signals applied via one or more control terminals. In one example, where the power amplifier circuit is implemented in part or in full as a digital circuit, digital components of the circuit may be coupled to a digital programming bus via which the control signals are applied to the digital components. In this example, control terminals 222, 224, 228 and 234 would all be part of the digital programming bus. The control signals may be supplied over the digital programming bus as one or more digital control words, as discussed further below.

Figure 5A:
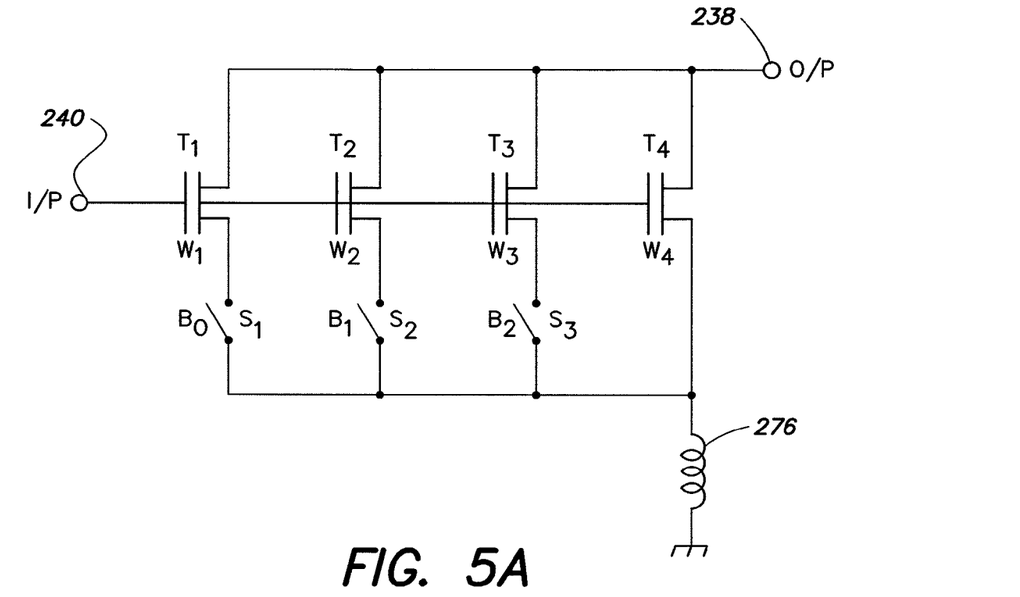
FIG. 5A is a circuit diagram of one example of a transistor with programmable gate width, according to aspects of the invention.
Figure 5B:
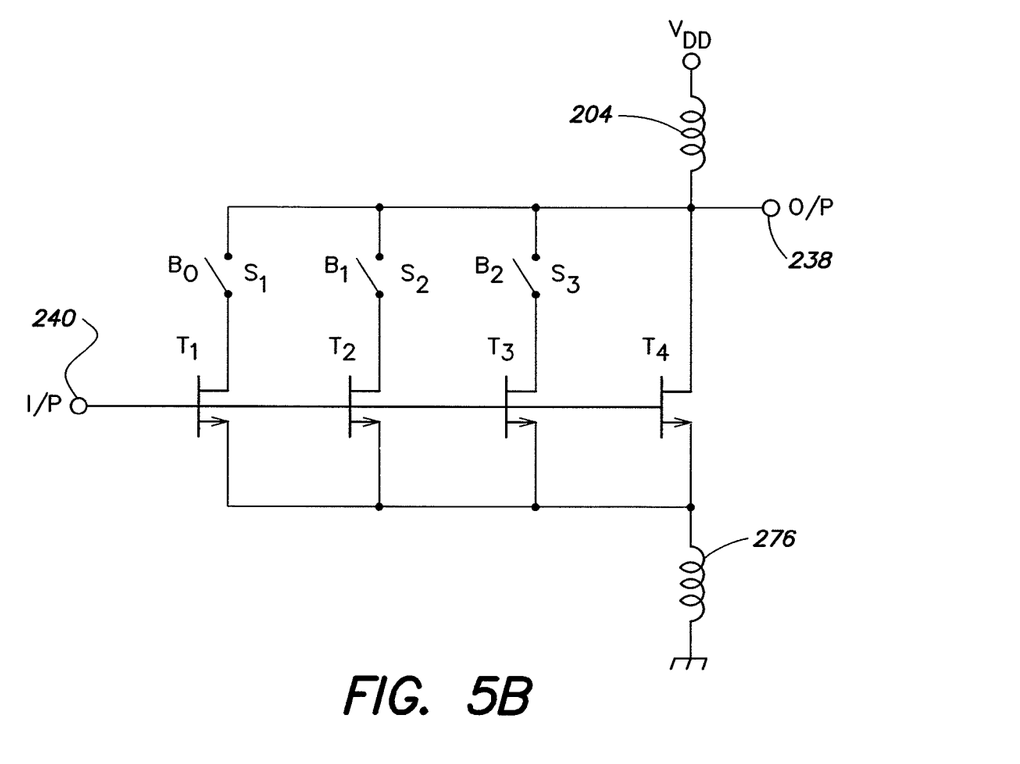
FIG. 5B is a circuit diagram of another example of a transistor with programmable gate width, according to aspects of the invention.
Figure 5C:
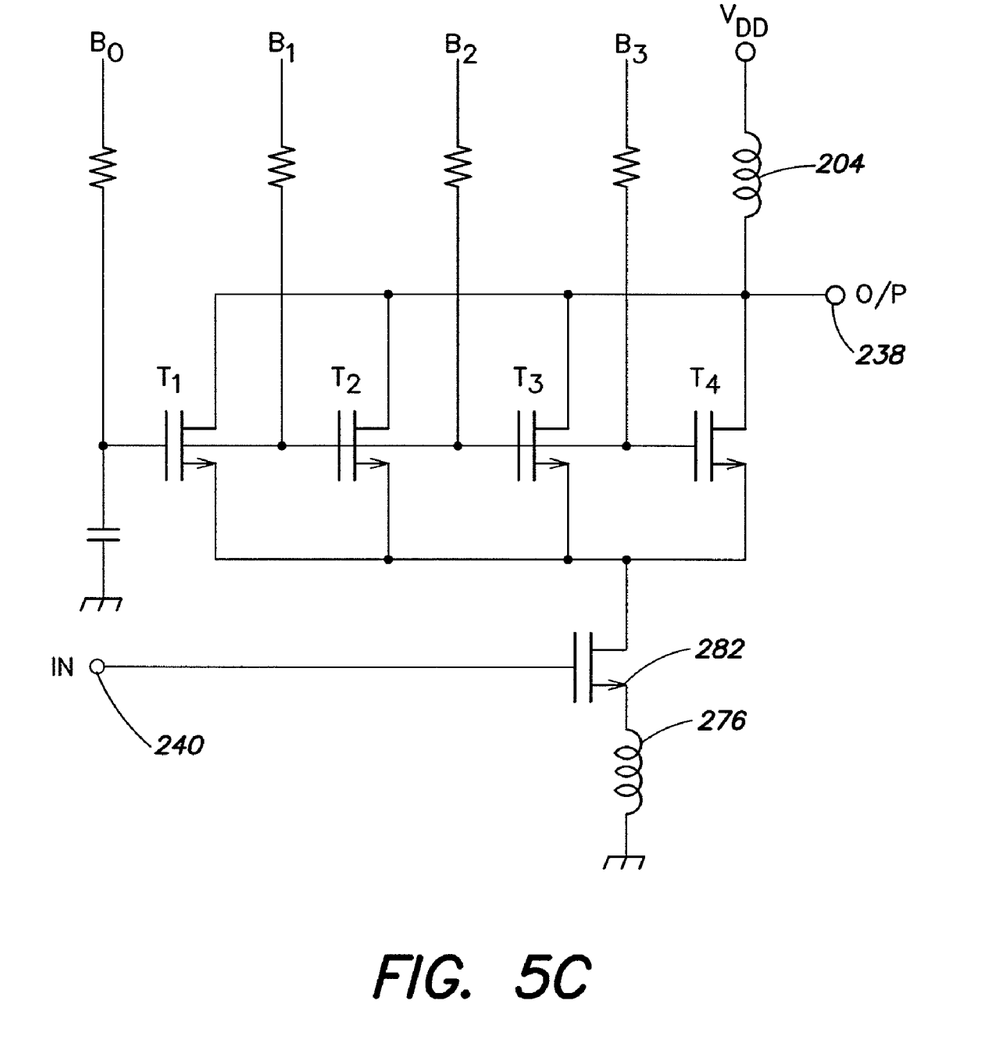
FIG. 5C is a circuit diagram of another example of a transistor with programmable gate width, according to aspects of the invention.

As discussed above, one parameter of the power transistor 202 that may be tunable is the device width. Referring to FIGS. 5A, 5B and 5C, there are illustrated examples of circuit topologies that may allow dynamic ("on the fly") tuning of the device width. FIGS. 5A and 5B illustrate example common source implementations, and FIG. 5C illustrates an example cascode implementation corresponding to the common source implementations shown in FIGS. 5A and 5B. In one example, the cascode configuration of FIG. 5C offers the added benefit of lower input capacitance due to minimal miller multiplication of the input gate-source capacitance (Cgs) which results in a greater tuning bandwidth. In the illustrated examples, the power transistor 202 comprises four individual transistors T1, T2, T3 and T4, the individual source or drain contacts of which are commonly connected to an output contact 238. However, it is to be appreciated that the invention is not limited to the use of four transistors and any number of transistors may be used. Furthermore, depending on the circuit configuration, additional transistors, such as the transistor 282 illustrated in FIG. 5C, may also be included. Switches S1, S2 and S3 may be controlled by the bits B0, B1 and B2, respectively, of a digital control signal supplied via a digital programming bus, as discussed further below. In FIG. 5C, the inductor 276 provides loss-less series feedback which may help to linearize the transfer function of transistor 282.

As illustrated in FIGS. 5A and 5B, the individual gate contacts of the transistors T1, T2, T3 and T4 may be combined to a total input contact 240. This input contact 240 may be coupled to the input circuit 206 (see FIG. 2). As discussed above, it is to be appreciated that although the individual transistors T1, T2, T3 and T4 may be illustrated and discussed as MOS transistors (each having a gate, drain and source), the invention is not so limited and other types of transistors, such as BJT transistors may be used instead. Also, it is to be appreciated that the transistors may be n-type or p-type and appropriate modifications may be made to the circuit diagrams illustrated in FIGS. 5A-C to accommodate different types of transistors, as would be recognized by those skilled in the art.

According to one embodiment, each of the four transistors T1, T2, T3 and T4 has a particular gate width, referred to herein as W1, W2, W3, and W4, respectively. Generally, the gate width dimensions of the transistors may vary over a wide range depending on the circuit layout and the CMOS or other semiconductor (e.g., GaAs) process technology used to fabricate the power amplifier circuit. In one example, the gate widths may vary in a range from about 80 microns to about 700 microns. Digital programming of either a logical "1" or logical "0" to each of the four binary control inputs B0-B2 may produce an overall device behavior whose composite gate width can vary to be any of up to eighteen different sizes. The total gate width for the power transistor 202 may be determined by summing the individual gate widths of each transistor that is connected (i.e., the corresponding switch is closed). Therefore, if each of W1, W2, W3 and W4 are different, depending on the digital bit pattern that controls the values of B0-B2, the overall gate width can be controlled to any one of eighteen values.

In one example, the individual widths are selected to be successively doubled, such that $W2=2*W1$, $W3=4*W1$, etc. Of course, it will be recognized by those skilled in the art that the overall gate width may be varied among more or fewer values by increasing or decreasing the number of individual transistors and corresponding switches used in the circuit. Furthermore, it is not necessary that each switch S1, S2 and S3 be controlled by a single bit of a digital control word. Rather, each switch may be controlled by multiple bits of a digital control word or by an analog control signal.

In addition to frequency tuning and controlling the device width, other considerations for implementing a programmable multi-band, multi-standard power amplifier circuit such as that shown in FIG. 4 may include maintaining a high Q for the output network 208 (in order to minimize power loss in the impedance elements) and controlling the various programming variables to optimize device performance. The Q of a circuit is defined as the ratio of stored energy in the resonance circuit to the dissipated energy from the resonance circuit. According to one embodiment, the high Q and/or low power dissipation criteria may be met by using microstrip or bondwire inductors, high Q varactors and/or switchable capacitor banks to implement aspects of the circuit, such as illustrated, for example, in FIG. 6.

Figure 6:
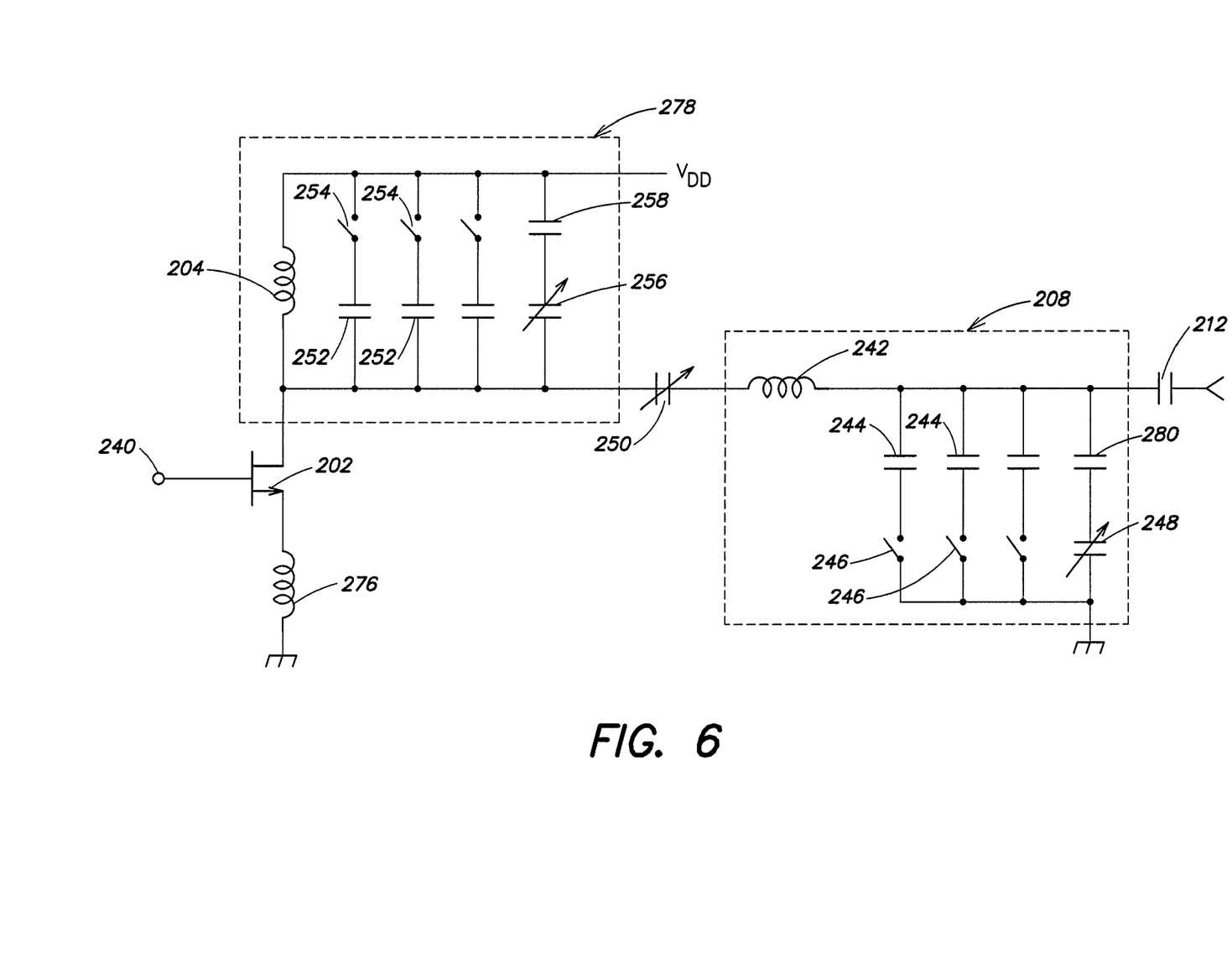
FIG. 6 is a diagram of one example of a programmable power amplifier circuit according to aspects of the invention.

Referring to FIG. 6, the impedance elements (FIG. 2; 220) of the output network 208 may be implemented using a combination of an inductor 242, a bank of switchable capacitors 244 (coupled to corresponding switches 246) and a variable capacitor 248. A fixed-value capacitor 280 may also be included, as illustrated. These capacitors 244 may be, for example, MOS (metal oxide semiconductor) or MIM (metal-insulator-metal) capacitors. One or more control signals may be applied to actuate the switches 246, thereby switching ones of the capacitors 244 into and out of electrical connection with the circuit making up the output network 208. As discussed above, these control signals may include one or more analog control signals, or a digital control word, with individual bits of the word actuating individual ones of the switches 246. Similarly, a control signal (analog or digital) may be applied to the variable capacitor 248 to tune the capacitance thereof. In one example, the variable capacitor 248 includes one or more high Q varactor diodes. By selecting tuning the variable capacitor 248 and switching in and out selected ones of the switchable capacitors 244, the total reactance, and thus impedance, of the output network 208 may be varied.

According to one embodiment, the bias circuit 278 for the power transistor 202 is also at least partially tunable to account for varying operating frequencies and standards. Because it may be difficult to construct a bias choke inductor 204 having a sufficiently high value so as to provide a high impedance at the frequencies of interest for many transceivers, the transistor bias signal may be injected through a parallel resonance bias circuit 278, such as that shown in FIG. 6, rather than through a lone bias choke inductor. For example, in FIG. 6, the bias circuit 278 comprises a combination of the bias choke inductor 204, a bank of switchable capacitors 252, coupled to corresponding switches 254, a fixed capacitor 258 and a variable capacitor 256, the combination forming an open parallel resonance circuit. The variable capacitor 256 may include, for example, a varactor diode. The switchable capacitors 254, which can be switched into and out of the bias circuit 278 by actuating the corresponding switches 254 responsive to a control signal, may be used to change the resonant frequency of the bias choke. By changing the resonance frequency, the switchable capacitor arrangement allows at least partial tuning of the operating frequency of the power amplifier circuit. The fixed capacitor 258 and variable capacitor 256 provide a fine tuning capability to the bias circuit 278. Capacitor 258 may be referenced to ground, rather than to the supply, $V_{DD}$, to change the polarity effect of the fine frequency tuning. In addition, in one example, the capacitor 258 isolates the DC supply from signals generated in a feedback loop configuration discussed below with reference to FIG. 10, and reduces the parasitic capacitance seen across the inductor 204. In one example, the varactor 250 changes the coupling coefficient between the two parallel resonators of FIG. 6 (namely, the bias circuit 278 and output network 208). This allows for the load impedance seen by the transistor 202 to be either stepped-up or stepped-down in the frequency band of interest.

According to one embodiment, inductors in the power amplifier circuit, such as the inductors 204, 276 and 242 illustrated in FIG. 6 may be formed by a transmission line structure, such as microstrip lines, coplanar waveguide lines, or bondwires. As known to those skilled in the art, active devices provided as semiconductor integrated circuits are coupled to the device package, for example, a base substrate or lead frame, using a plurality of bondwires. Each of these bondwires has associated with it a certain inductance that is dependent on the length of the bondwire, the cross-sectional area of the bondwire and the spacing between adjacent bondwires (which affects mutual inductive coupling between adjacent bondwires). A particular inductance can therefore be implemented by suitably adjusting length, cross section, and spacing of the bondwires. In this manner, parasitic inductance inherent to the semiconductor assembly can be utilized to replace conventional "on-chip" inductors, such as the spiral inductors conventionally used in many radio frequency integrated circuits (RFICs). It is to be appreciated however, that invention is not limited to the use of bondwires and other types of transmission lines, such as microstrip lines and coplanar waveguide lines may be used instead of or in addition to bondwires. Accordingly, although for clarity the following discussion will refer primarily to bondwires, it is to be understood that the principles discussed apply equally to other types of transmission lines.

Figure 7:
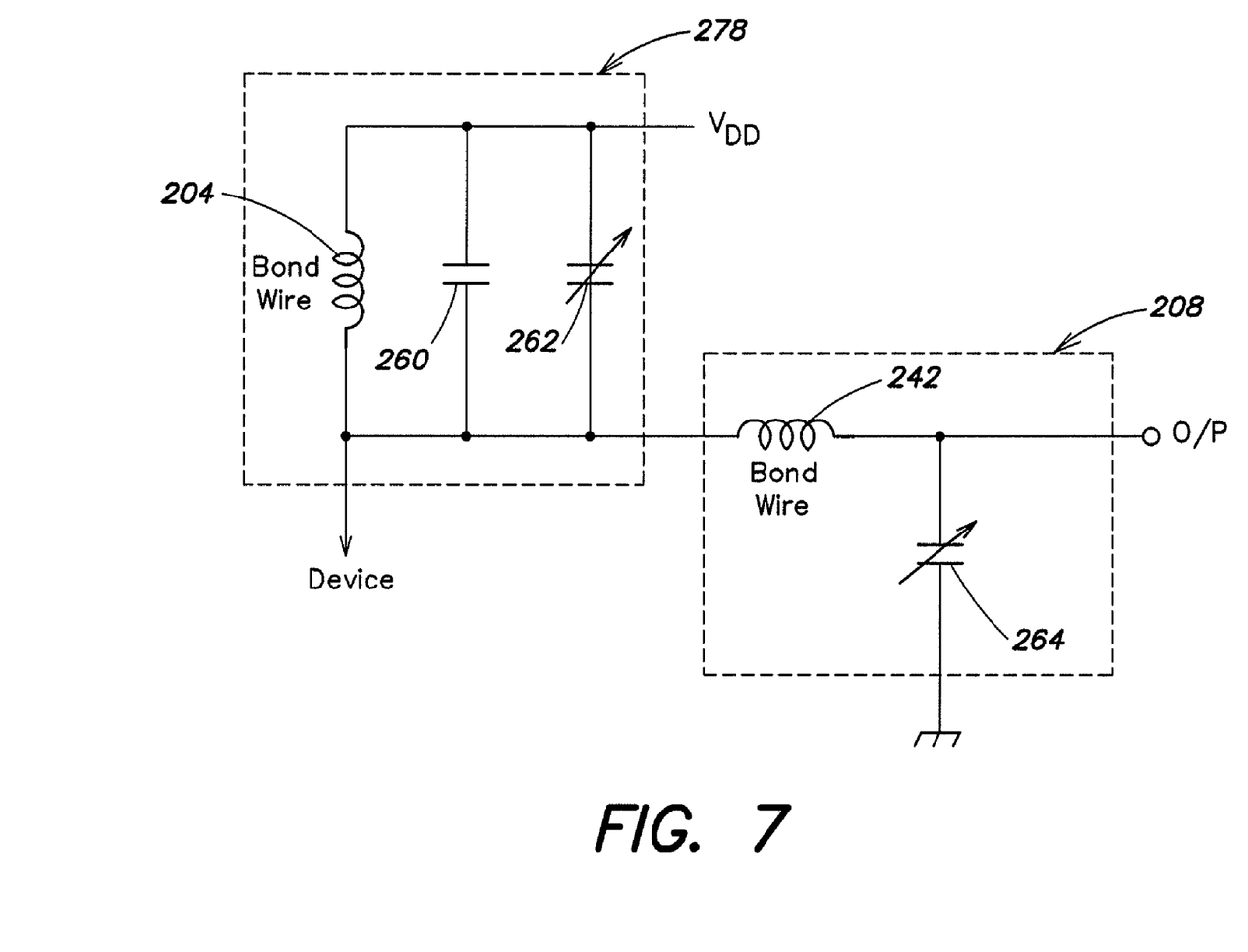
FIG. 7 is a diagram of another example of a programmable power amplifier circuit according to aspects of the invention

Referring to FIG. 7, there is illustrated another example of a portion of a programmable power amplifier circuit. In this example, the inductors 242 and 204 may again be implemented using bondwires or other transmission lines. One advantage of bondwire inductors over conventional spiral inductors is that bondwire inductors do not take up large chip areas. Also, because the bondwires are external to the active device, little electromagnetic field interference or coupling into the chip area is induced. However, a disadvantage is that the self-inductance of the bondwires may vary largely, for example, up to about 30% between different fabrications, due to process variations such as wire length, wire height, soldering condition variations, etc. However, this disadvantage may be mitigated because inductance variations can be compensated for by using a variable capacitance in combination with the inductors. For example, as shown in FIG. 7, the output network 208 may include a variable capacitor 264, the capacitance of which may be varied by applying a control signal, as discussed above. This variable capacitor 264 may be tuned to affect the overall impedance of the output network 208, as discussed above, and/or to compensate for process variations in the value of the inductance of inductor 242. Although not shown in FIG. 7, the output network may also include one or more fixed capacitors that may be used to account for variance in the bondwire inductance due to manufacturing variability, and/or the switchable capacitors 244 (see FIG. 6) may be used for this purpose as well. Similarly, the parallel resonance bias circuit 278 may include a capacitor 260 and/or variable capacitor 262 to compensate for process variations in the inductance of inductor 204, as well as to provide the biasing and tuning functions discussed above.

Figure 8A:
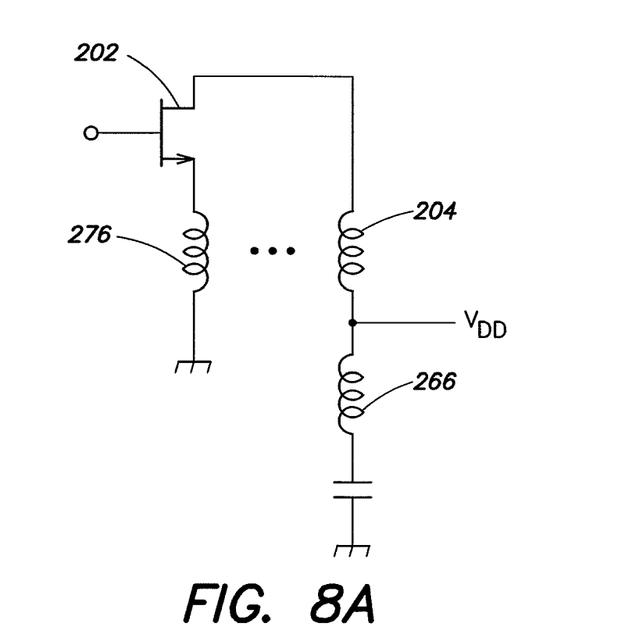
FIG. 8A is a circuit diagram of one example of an inductively coupled transistor according to aspects of the invention.
Figure 8B:
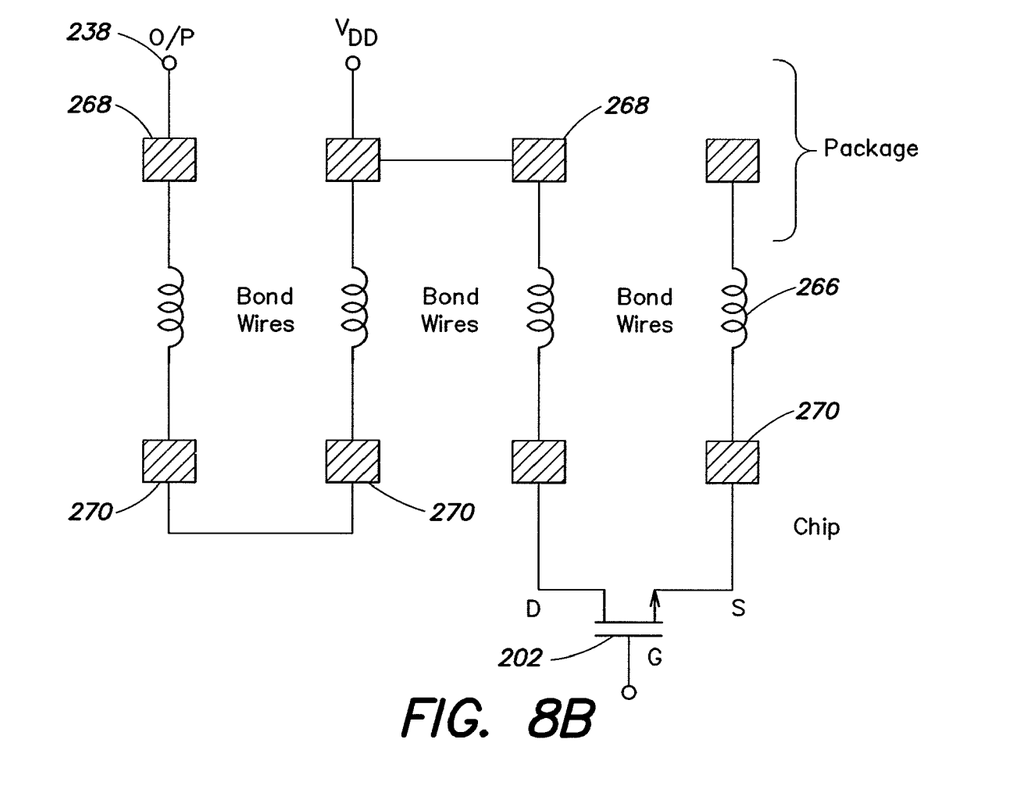
FIG. 8B is a diagram illustrating an example of a bondwire configuration for implementing the inductors of FIG. 8A, according to aspects of the invention.
Figure 9A:
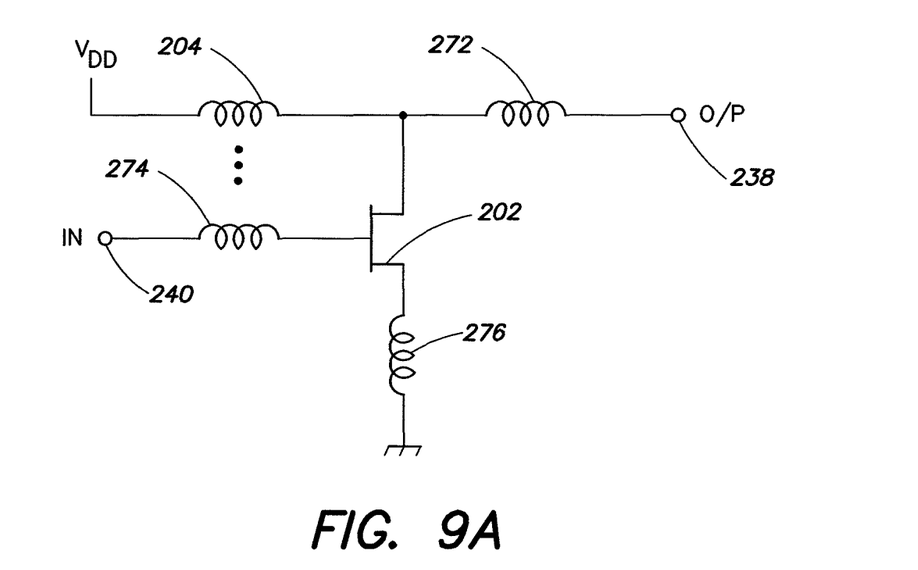
FIG. 9A is circuit diagram of another example of an inductively coupled transistor according to aspects of the invention.
Figure 9B:
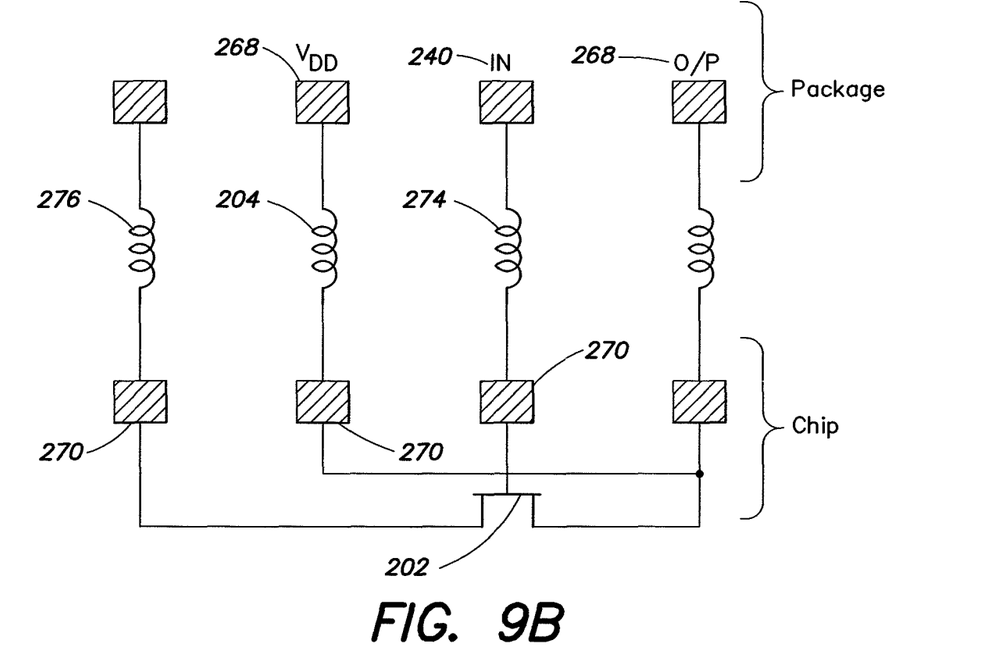
FIG. 9B is diagram illustrating an example of a bondwire configuration for implementing the inductors of FIG. 9A, according to aspects of the invention.

FIGS. 8A and 9A illustrate some example configurations of inductors used to couple the power transistor 202 to the supply voltage, $V_{DD}$, input circuit and output network. FIGS. 8B and 9B illustrate corresponding bondwire configurations to implement the inductor configurations shown in FIGS. 8A and 9A, respectively. As discussed above, bondwires are used to couple the active device integrated circuit (the "chip") to the package substrate or lead frame. Thus, referring to FIGS. 8A-9B, the inductors 204, 266, 272, 274 and 276 shown in FIGS. 8A and 9A may be implemented using bondwires connecting contact pads 268 on the package substrate or lead frame to contact pads 270 on the chip, as shown in FIGS. 8B and 9B. It is to be appreciated that any of the inductors 204, 266, 272, 274 and 276 may be implemented using multiple bondwires coupled between multiple pads, and that each inductor 204, 266, 272, 274 and 276 does not necessarily correspond to only a single bondwire. In FIGS. 9A and 9B, the inductors 204 and 274 form a lossless parallel feedback network that may significantly enhance performance of the power amplifier. This lossless network may be tuned in frequency by the switchable capacitor and/or tunable variable capacitor arrangements discussed above.

Figure 10:
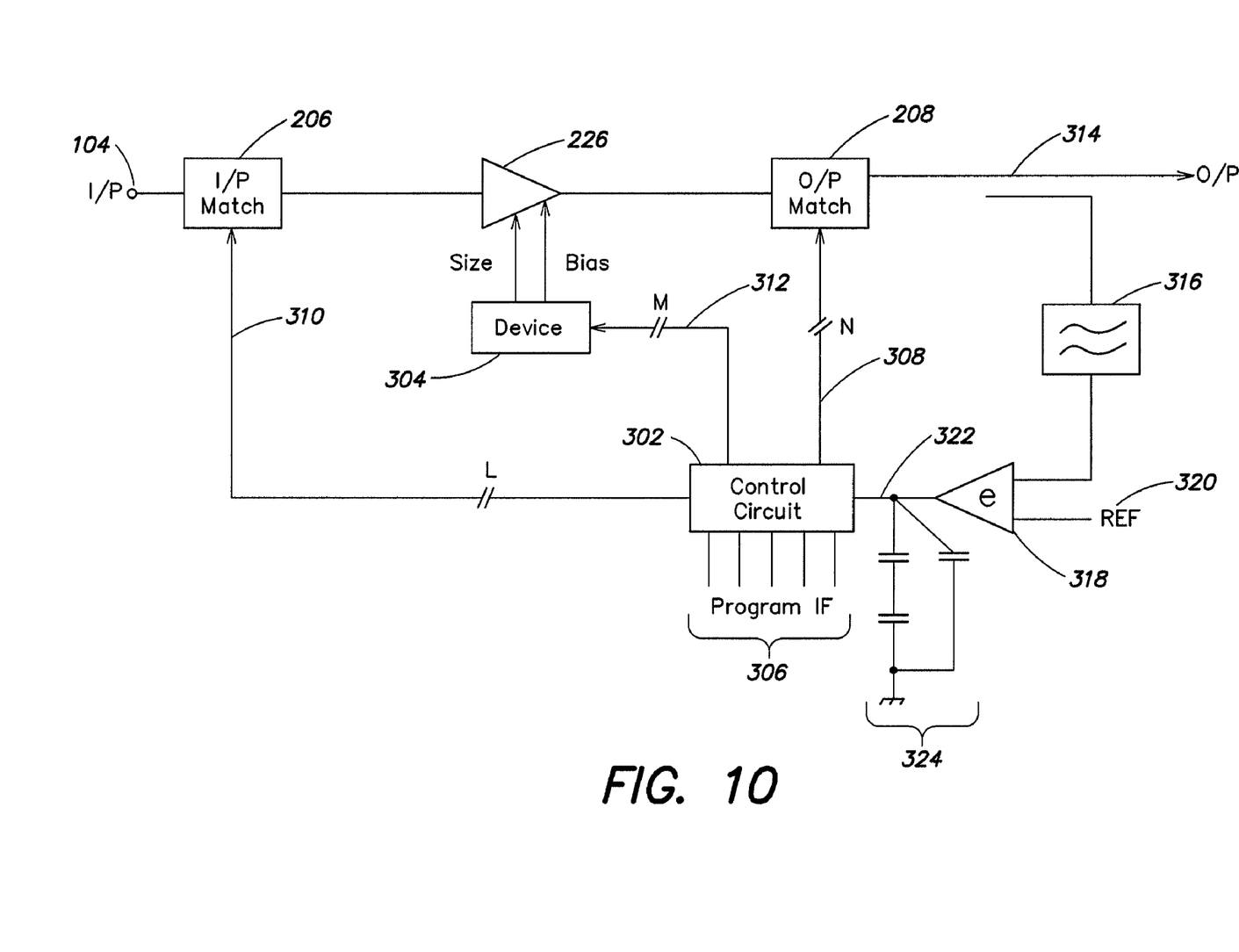
FIG. 10 is a block diagram of one example of a digital programmable power amplifier circuit according to aspects of the invention.

As discussed above, control and organization of the various programming (control) signals used to tune or program parameters of the various components of the power amplifier circuit may be desirable for optimal performance of the power amplifier. Referring to FIG. 10 there is illustrated a block diagram of one example of a programmable power amplifier circuit incorporating a feedback loop to tune parameters of the circuit to improve performance of the power amplifier. As discussed above, the power amplifier circuit includes an amplifier stage 226, which may include the power transistor 202 discussed above, coupled between an input circuit 206 and output network 208 used for impedance matching. The impedance of the input circuit 206 and output network 208 may be programmable responsive to one or more impedance control signals, as discussed above. In the example illustrated in FIG. 10, the impedance control signals are provided as digital control words from a control circuit 302. A device 304 may be coupled between the control circuit 304 and the amplifier 300, as discussed further below.

The control circuit 302 may supply digital control words on lines 308, 310 and 312 to program parameters of the output network 208, input circuit 206 and amplifier stage 226, respectively, as discussed above. It is to be appreciated that lines 308, 310 and 312 may form part of a digital programming bus, as discussed above, and the control signals applied to any or all of the output network 208, input circuit 206 and amplifier stage 226 may be one or more digital control words provided via this digital programming bus. The control circuit 304 may itself receive programming signals 306, for example, from a microprocessor or other controller (not shown). The digital control words supplied on lines 308 (to the output network 208), 310 (to the input circuit 206) and 312 (to the amplifier 226) may have the same or different numbers of bits which may be selected, for example, based on the number of programmable elements in the input circuit 206 and output network 208. For example, the digital control word supplied on line 308 may have N bits, the digital control word supplied on line 310 may have L bits, and the digital control bit supplied on line 312 may have M bits, as illustrated in FIG. 10. In another example, the control signals supplied to the output network 208, input circuit 206 and amplifier stage 226 may be varying numbers of bits (e.g., N, L and M, respectively) of a single composite control word provided on the digital programming bus.

In one embodiment, a sample of at least a portion of the output spectrum may be taken from the output line 314 and used for feedback control. The sample may be detected and/or filtered by block 316 and fed to an error detector 318. The error detector 318 also receives a reference signal on line 320 from a reference amplifier (not shown). The error detector 318 may compare (e.g., using a subtraction operation) the received sample output spectrum with the reference signal and provide an error signal on line 322 to the control circuit 302. In one example, a loop filter 324 controls the dynamics of the feedback loop. From the error signal, the control circuit 302 may determine the level of distortion of the output spectrum relative to the reference signal. For example, the control circuit 302 may determine the level of harmonic content, the EVM and/or the amount of out-of-band energy in the output spectrum. Based on this determination, the control circuit 302 may adjust the values of the digital control words supplied on any or all of lines 308, 310 and 312 to adjust the parameters of the amplifier 226 and/or impedance of the input circuit 206 and/or output network 208 to decrease the distortion level, thereby enhancing the performance of the power amplifier circuit. In one embodiment, the control circuit 302 controls the feedback loop parameters and the device 304 is used to decode the feedback parameters into device programming parameters, such as bit patterns to control the switches in the circuit (such as the switches used to select among the switchable capacitors), bias current values and/or bias voltage values. It is to be appreciated that the device 304 need not be a separate component from the control circuit 302 and in some examples may be a part of the control circuit 302.

Furthermore, if the transceiver in which the power amplifier is being used is switched from one operating frequency band to another, or from one communications standard to another, the feedback control loop may facilitate fast reprogramming of the impedances and/or device characteristics to allow the power amplifier to operate efficiently at the new frequency and/or standard. In one example, the control circuit 302 uses a closed feedback loop and look-up tables to converge to optimal (or near optimal) configuration of the digital control words, and thus the circuit components, based on a search algorithm. Examples of search algorithms that may be used include successive approximation (SAR) algorithms and Razor search algorithms.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. In addition, it is to be appreciated that many variations of the tunable capacitor arrangements illustrated are possible. All switchable capacitors and tunable variable capacitors may be used to manipulate output or input impedance of the power amplifier circuit so that it can be optimized for or tuned to a particular operating frequency band or for a particular efficiency. The different individual locations of the capacitors in the power amplifier circuit, the number of capacitors used and their arrangements may affect the impedance differently, as will be appreciated by those skilled in the art. In addition, some or all of these capacitors may be used to change the order (N) of the matching network in which they are used, and thus to change the matching bandwidth. Accordingly, the foregoing description and drawings are by way of example only, and the scope of the invention should be determined from proper construction of the appended claims, and their equivalents.

What is claimed is:

1. A programmable power amplifier comprising:
an amplifier comprising a power transistor;
an impedance matching input circuit coupled to an input of the amplifier; and
an impedance matching output network coupled to an output of the amplifier, the impedance matching output network having a programmable impedance that is adjustable responsive to an impedance control signal;
wherein the power transistor comprises a programmable bias circuit including a parallel resonance circuit comprising an inductor and a bank of switchable capacitors that are switched into and out of the bias circuit responsive to a bias control signal.

2. The programmable power amplifier as claimed in claim 1, wherein the impedance matching output network comprises a plurality of impedance elements including at least one programmable impedance element that is programmable responsive to the impedance control signal.

3. The programmable power amplifier as claimed in claim 2, wherein the at least one programmable impedance element includes a bank of switchable capacitors.

4. The programmable power amplifier as claimed in claim 2, wherein the at least one programmable impedance element includes a varactor.

5. The programmable power amplifier as claimed in claim 1, wherein the impedance matching input circuit comprises at least one programmable impedance element that is programmable responsive to a second impedance control signal.

6. The programmable power amplifier circuit as claimed in claim 1, wherein the parallel resonance circuit further comprises a varactor.

7. A programmable power amplifier, comprising:
an amplifier comprising a power transistor;
an impedance matching input circuit coupled to an input of the amplifier; and
an impedance matching output network coupled to an output of the amplifier, the impedance matching output network having a programmable impedance that is adjustable responsive to an impedance control signal;
wherein the power transistor has a variable gate width, and wherein the variable gate width is programmable responsive to a transistor control signal.

8. A digital programmable power amplifier comprising:
an amplifier stage;
a programmable impedance matching input circuit coupled to an input of the amplifier stage;
a programmable impedance matching output network coupled to an output of the amplifier stage;
an error generator coupled to an output of the programmable impedance matching output network and configured to compare a signal received from the programmable impedance matching output network with a reference signal to generate an error signal;

a control circuit coupled to the error generator and configured to receive the error signal; and a digital programming bus coupled to the control circuit and to each of the amplifier stage, the programmable impedance matching input network and the programmable impedance matching output network;

wherein the control circuit is configured to generate at least one digital control signal responsive to the error signal and to provide the at least one digital control signal to the amplifier, the programmable impedance matching input network and the programmable impedance matching output network via the digital programming bus; and wherein parameters of the amplifier, the programmable impedance matching input network and the programmable impedance matching output network are variable responsive to the at least one digital control signal.

9. The digital programmable power amplifier as claimed in claim 8, wherein the parameters that are variable responsive to the at least one digital control signal include an impedance of the impedance matching output network.

10. The digital programmable power amplifier as claimed in claim 8, wherein the parameters that are variable responsive to the at least one digital control signal include an impedance of the impedance matching input network.

11. The digital programmable power amplifier as claimed in claim 8, wherein the parameters that are variable responsive to the at least one digital control signal include a device width of the amplifier.

12. The digital programmable power amplifier as claimed in claim 11, wherein the amplifier includes a FET transistor, and wherein the parameters that are variable responsive to the at least one digital control signal include the gate width of the FET transistor.

13. A method of tuning an operating frequency of a power amplifier that includes a power transistor and an programmable impedance matching output network, the method comprising:

comparing at least a portion of an output signal from the power amplifier with a reference signal to generate an error signal;

generating a control signal responsive to the error signal;

varying an impedance of the programmable impedance matching output network of the power amplifier responsive to the control signal;

varying a gate width of the power transistor responsive to a transistor control signal.

* * * * *